United States Patent [19]

Fujimoto et al.

[11] Patent Number: 4,758,640

[45] Date of Patent: Jul. 19, 1988

[54] VINYLSILYL GROUP-CONTAINING MONODISPERSE POLYMERIC COMPOUND AND A METHOD FOR THE PREPARATION THEREOF

[75] Inventors: Teruo Fujimoto; Minoru Takamizawa; Akira Yamamoto; Toshinobu Ishihara, all of Niigata, Japan

[73] Assignee: Shin-Etsu Chemical Co., Ltd., Tokyo, Japan

[21] Appl. No.: 861,739

[22] Filed: May 7, 1986

Related U.S. Application Data

[63] Continuation of Ser. No. 660,718, Oct. 15, 1984, abandoned.

[30] Foreign Application Priority Data

Oct. 24, 1983 [JP] Japan ................................. 58-198928

[51] Int. Cl.$^4$ ........................ C08F 4/46; C08F 230/08
[52] U.S. Cl. .................................... 526/173; 526/183; 526/279
[58] Field of Search ............... 526/183, 279, 209, 173

[56] References Cited

U.S. PATENT DOCUMENTS 4,124,751 11/1978 Fischer et al. .................... 526/183
4,252,925 2/1981 Fukudo et al. .................... 526/173
4,301,231 11/1981 Atarashi et al. .................... 430/287

Primary Examiner—Joseph L. Schofer
Assistant Examiner—Peter F. Kulkosky
Attorney, Agent, or Firm—Jules E. Goldberg

[57] ABSTRACT

The invention provides a novel polymeric compound having crosslinkability by irradiation with actinic rays, e.g. ultraviolet light, and useful as a polymeric base ingredient of a negative type photoresist composition with high sensitivity and resistance against dry etching. The polymer is obtained by the anionic living polymerization of a vinylsilyl group-containing styrene derivative of the formula $$CH_2=CH-C_6H_4-(CH_2)_n SiR_2-CH=CH_2,$$

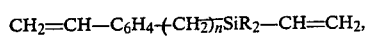

in which R is a monovalent hydrocarbon group, e.g. methyl and phenyl, and n is an integer of 0 to 3, in a specific solvent in the presence of a specific polymerization initiator so that the polymerization takes place only at the styrenic vinyl groups leaving the silicon-bonded vinyl groups unpolymerized. Quite unexpectedly, the polymer has a very uniform monodisperse distribution of the molecular weight.

3 Claims, 4 Drawing Sheets

WAVE NUMBER, cm$^{-1}$

VINYLSILYL GROUP-CONTAINING MONODISPERSE POLYMERIC COMPOUND AND A METHOD FOR THE PREPARATION THEREOF

This is a continuation of application Ser. No. 660,718, filed Oct. 15, 1984, now abandoned.

BACKGROUND OF THE INVENTION

The present invention relates to a novel vinylsilyl group-containing polymeric compound having a monodisperse distribution of the molecular weight and a method for the preparation thereof. More particularly, the invention relates to a vinylsilyl group-containing monodisperse polymeric compound having curability by irradiation with actinic rays and useful as a negative-type photoresist material and a method for the preparation thereof.

In the electronic technology of recent years, a variety of semiconductor devices are being manufactured by the precision photolithographic techniques using a photoresist material which may be of the negative type or positive type. Along with the progress of the electronic technology, the demand for the fine working is increasing more and more reaching the precision of so-called submicron range and the photoresist material is also required to have a high sensitivity and high resolving power.

As is known, the use of a negative type polymeric photoresist material constitutes the major current of the above mentioned photolithographic techniques in the electronic industry in comparison with positive type ones. The negative type photoresist material should satisfy various requirements to be practically usable including: (1) that the photoresist material has a high sensitivity to crosslink formation when irradiated with actinic rays such as ultraviolet light, far ultraviolet light, electron beams, X-rays and the like; (2) that substantial changes should be produced in the molecular structure and properties before and after the irradiation with actinic rays such as a difference in the solubility parameter as large as possible caused by the crosslink formation; (3) that the polymeric material has an adequate molecular weight and the molecular weight distribution should be as narrow as possible; i.e. monodisperse, if possible, in order to obtain increased sensitivity and resolving power; (4) that the glass transition temperature $T_g$ should be relatively high; (5) that the layer of the photoresist composition should have good adhesion to the surface of the substrate on which it is formed; and (6) that the photoresist layer after patterning should have a high resistance against dry etching.

Of the currently used negative type photoresist materials, the most widely used are those based on a cyclized rubber but none of the photoresist materials available on the market satisfies all of the above described requirements simultaneously so that it is eagerly desired in the technology of electronics to develop a negative type polymeric photoresist material capable of satisfying these requirements.

SUMMARY OF THE INVENTION

It is therefore an object of the present invention to provide a novel negative type polymeric photoresist material capable of complying with the requirements for the material as described above.

Another object of the invention is to provide a novel organosilicon polymer having very uniform distribution of the molecular weight and capable of being cured by the irradiation with actinic rays with high sensitivity and usable as a photoresist material.

A further object of the invention is to provide a method for the preparation of the above mentioned photosensitive polymeric material.

Thus, the method of the present invention comprises anionic living polymerization of a vinylsilyl group-containing monomeric derivative of styrene represented by the general formula

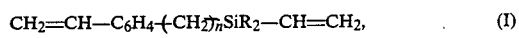

$$CH_2=CH-C_6H_4-(CH_2)_nSiR_2-CH=CH_2, \quad (I)$$

in which R is a monovalent hydrocarbon group selected from the class consisting of alkyl groups having from 1 to 4 carbon atoms and phenyl group and n is an integer of 0, 1, 2 or 3, under such conditions that the polymerization takes place solely of the vinyl group directly bonded to the phenylene group —$C_6H_4$— leaving the vinyl group bonded to the silicon atom unpolymerized.

In particular, the anionic living polymerization of the monomer is performed in a solution of 2-methyltetrahydrofuran or a dialkyl ether and using cumyl cesium as the initiator for the living polymerization.

Accordingly, the novel monodisperse polymeric compound of the invention useful as a negative type photoresist material is expressed by the structural formula of the unit

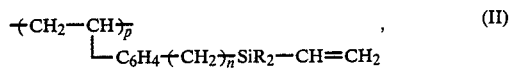

$$-(CH_2-CH)_p^- \atop \quad\quad |_{C_6H_4-(CH_2)_nSiR_2-CH=CH_2}} \quad (II)$$

in which n and R have the same meaning as defined above and p is a positive number corresponding to the degree of polymerization of the polymer.

DETAILED DESCRIPTION OF THE PREFERRED EMBODIMENTS

Figure 1:
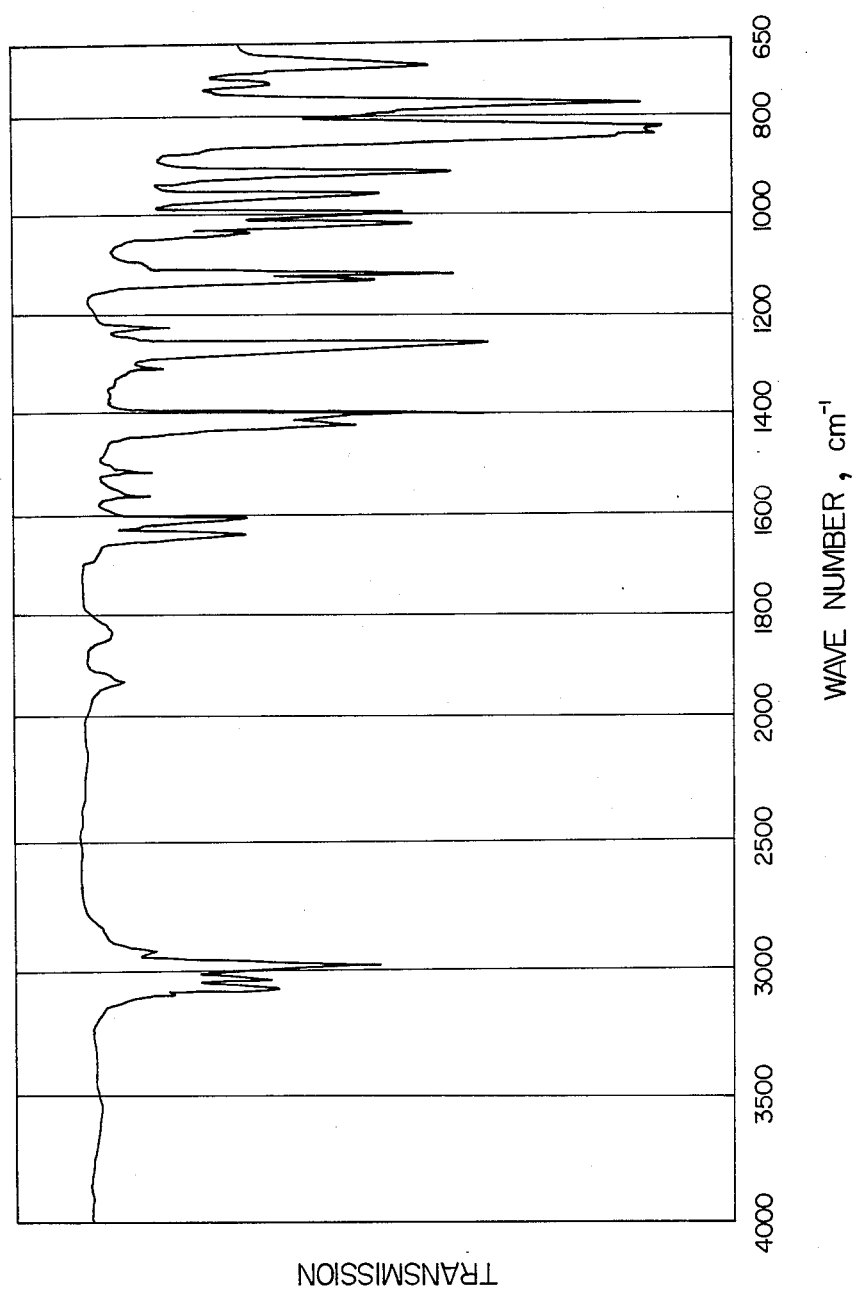
FIG. 1 illustrates an infrared absorption spectrum of 1-vinyl-4-(dimethylvinyl silyl) benzene prepared in Example 1.

The starting monomeric compound used in the inventive method is a vinylsilyl group-containing derivative of styrene represented by the general formula (I) above. Such a compound can readily be synthesized by the reaction between a vinylphenyl magnesium chloride, i.e. a Grignard reagent derived from a vinyl chlorobenzene of the formula $CH_2=CH-C_6H_4-Cl$ and an ω-haloalkyl vinyl dihydrocarbylsilane represented by the general formula

$$X-(CH_2)_nSiR_2-CH=CH_2, \quad (III)$$

in which n and R each have the same meaning as defined above and X is a halogen, e.g. chlorine, bromine and iodine, atom.

Exemplary of some of the compounds obtained in the above mentioned reaction are: 1-vinyl-4-(dimethyl vinyl silyl) benzene; 1-vinyl-3-(dimethyl vinyl silyl) benzene; 1-vinyl-4-(methyl phenyl vinyl silyl) benzene; 1-vinyl-4-(diethyl vinyl silyl) benzene; 1-vinyl-4-(dimethyl vinyl silyl)methyl benzene; 1-vinyl-4-(dimethyl vinyl silyl)ethyl benzene; and 1-vinyl-4-(dimethyl vinyl silyl)propyl benzene.

The above mentioned vinylsilyl-containing styrene compound should be used in the polymerization preferably after purification by distillation in the presence of a purification agent composed of a mixture of triphenylmethyl lithium $(C_6H_5)_3C.Li$ and lithium bromide LiBr under high vacuum according to a known procedure.

As is known, anionic living polymerization of such a monomeric compound can be performed in various ways and the inventors have undertaken extensive investigations for each of the possible polymerization procedures arriving at a conclusion that the above described vinylsilyl-containing styrene derivatives can be polymerized in a solution of 2-methyltetrahydrofuran or a dialkyl ether, e.g. diethyl ether, diisopropyl ether and dibutyl ether, in the presence of cumyl cesium as the polymerization initiator at a temperature of $-50°$ C. or below or, preferably, in the range from $-50°$ to $-78°$ C. to give a linear-chain polymer of substantially monodisperse molecular weight distribution having an average molecular weight of, for example, 50,000 or larger according to the conditions of the polymerization. The concentration of the monomer in the polymerization mixture should be in the range from 3 to 50% by weight. When the monomer concentration is higher than 50% by weight, the molecular weight distribution of the resultant polymer may be broader while lower monomer concentrations than 3% by weight are undesirable in respect of the productivity as a matter of course. The concentration of the polymerization catalyst or initiator in the polymerization mixture should be determined according to the desired molecular weight of the resultant polymer since the catalyst concentration has the largest influence on the molecular weight of the polymer. It is noteworthy that the polymerization in this case takes place solely in the styrenic vinyl groups, i.e. the vinyl groups directly bonded to the benzene nucleus, and the vinyl groups bonded to the silicon atoms are left unpolymerized. The difference in the behaviors of these two types of vinyl groups is quantitative as is indicated by the infrared absorption spectroscopy and nuclear magnetic resonance absorption spectrometry. The monodisperse distribution of the molecular weight of the polymer is verified by the gel permeation chromatography and the determinations of the weight-average molecular weight $M_w$ and number-average molecular weight $M_n$ to give a $M_w/M_n$ ratio of 1.02 which is so close to the value of 1.00 in ideal monodisperse polymers.

The thus obtained polymeric compound is composed of the recurring units expressed by the formula (II) given above. The polymer is soluble in several organic solvents such as toluene, xylene, tetrahydrofuran and the like. The vinyl groups bonded to the silicon atoms are sensitive to actinic radiations and the polymer is crosslinked and insolubilized with high sensitivity when irradiated with various types of actinic rays including ultraviolet light, electron beams and the like so that it is useful as a negative type photoresist material having excellent resistance against dry etching.

In the following, examples are given to illustrate the preparation procedure and characterization of the inventive vinylsilyl-containing polymeric compound obtained according to the procedure of the invention as well as to illustrate the usefulness of the inventive polymer as a negative type photoresist material.

EXAMPLE 1

4-Vinylphenyl magnesium chloride, i.e. a Grignard reagent derived from 4-chlorostyrene, was prepared. Thus, 12 g (0.5 mole) of metallic magnesium and 200 ml of tetrahydrofuran were introduced into a flask of 500 ml capacity and the reaction was started by adding 0.5 ml of ethyl bromide followed by the dropwise addition of 69 g (0.5 mole) of 4-chlorostyrene over a period of 3 hours under reflux of the solvent in a stream of nitrogen gas. Then, 60 g (0.5 mole) of vinyl dimethyl chlorosilane were added dropwise ino the tetrahydrofuran solution of the Grignard reagent kept at 20° to 30° C. and the reaction mixture was poured into a large volume of water to dissolve away the magnesium salt followed by phase separation. The organic material obtained by the phase separation was distilled under reduced pressure to give 75 g of a fraction which could be identified to be 1-vinyl-4-(dimethyl vinyl silyl) benzene. The infrared absorption spectrum of this product is shown in FIG. 1.

Figure 2:
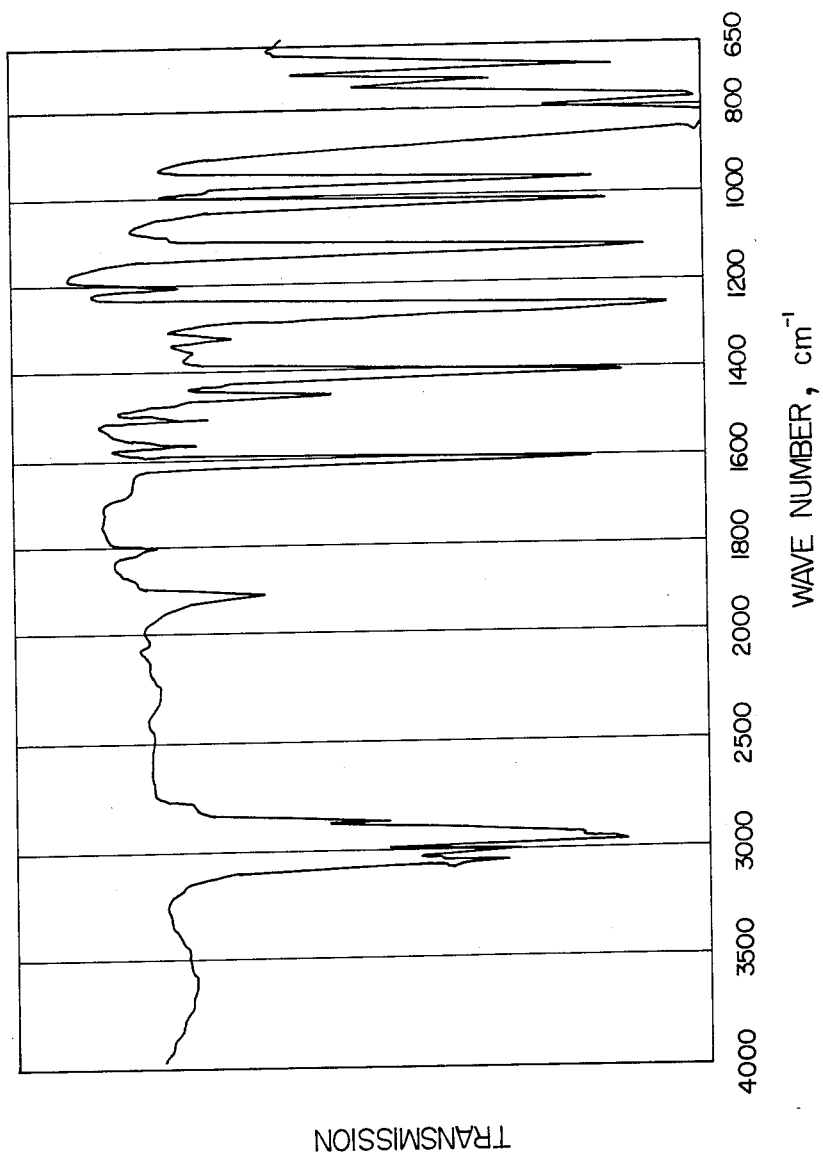
FIG. 2 illustrates an infrared absorption spectrum of the polymer obtained by the polymerization of the compound in FIG. 1 according to the inventive method.

The thus obtained vinylsilyl-containing compound was purified by distillation in the presence of a mixture of triphenylmethyl lithium and lithium bromide under high vacuum and 6 g of the purified compound were dissolved in 100 ml of purified 2-methyltetrahydrofuran as a solvent and admixed with $1.2 \times 10^{-4}$ mole of cumyl cesium as the polymerization initiator to effect anionic living polymerization under high vacuum at $-78°$ C. for 2 hours. After completion of the polymerization, the reaction mixture was poured into methyl alcohol to precipitate the polymer which was washed and dried to give a white polymeric material in an almost quantitative yield. FIG. 2 illustrates the infrared absorption spectrum of the thus obtained polymeric product. When this infrared absorption spectrum is compared with that in FIG. 1, disappearance is noted of the absorption band at a wave number of 1630 cm$^{-1}$ which is assignable to the styrenic vinyl group while the absorption assigned to the vinyl group bonded to the silicon atom remains unchanged. That is, the polymerization took place solely in the styrenic vinyl groups leaving the silicon-bonded vinyl groups unpolymerized. The glass transition temperature $T_g$ of this polymer was 100° C.

Figure 3:
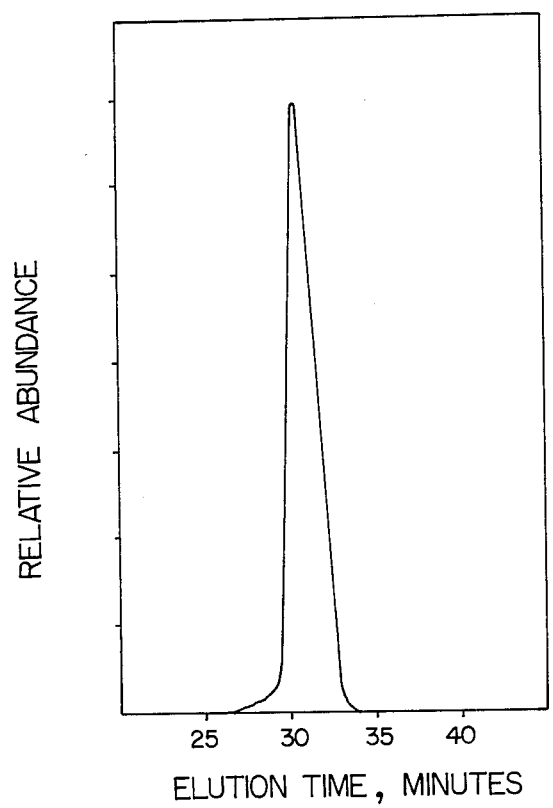
FIGS. 3 and 4 are each an elution diagram of the polymeric compound obtained in Example 1 or a similar comparative polymer, respectively, in the gel permeation chromatography.

The weight-average and number-average molecular weights of this polymeric product were determined by the method of membrane osmotic pressure and light scattering to give values of $M_w$ and $M_n$ of $5.1 \times 10^4$ and $5.2 \times 10^4$, respectively, with the $M_w/M_n$ ratio of 1.02. Further, gel permeation chromatography was undertaken with this polymeric compound to give an elution diagram shown in FIG. 3 having a single sharp peak. These results support that the molecular weight distribution of this polymeric product is very uniform to be close to an ideal monodisperse distribution.

COMPARATIVE EXAMPLE 1

Figure 4:
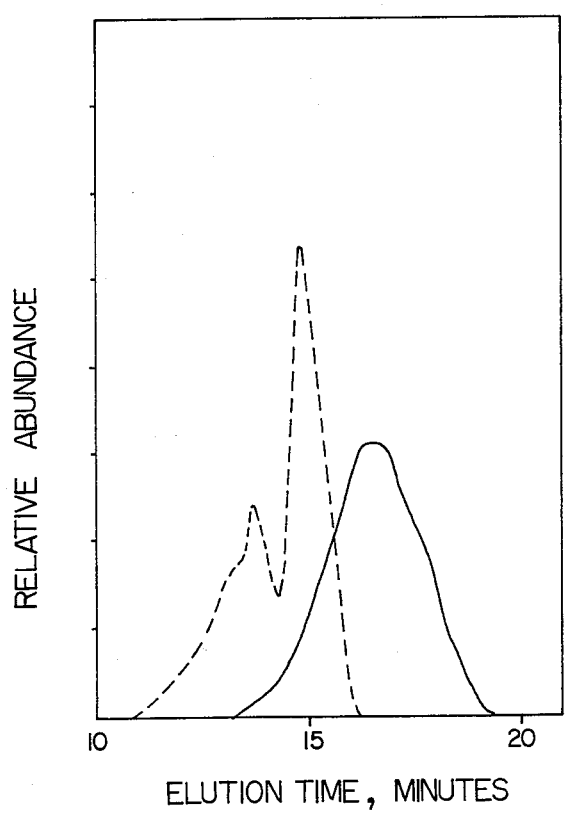

The experimental procedures for the polymerization of 1-vinyl-4-(dimethyl vinyl silyl) benzene were substantially the same as in Example 1 except that the solvent was tetrahydrofuran instead of 2-methyltetrahydrofuran and the polymerization initiator was n-butyl lithium or cumyl cesium. When the polymerization initiator was n-butyl lithium, the polymer was obtained in a yield of 60% and had a glass transition temperature $T_g$ of 70° C., weight-average molecular weight $M_w$ of $5.3 \times 10^4$ and number-average molecular weight $M_n$ of $2.6 \times 10^4$ corresponding to a $M_w/M_n$ value of 2.04. When cumyl cesium was used as the polymerization initiator, the yield of the polymer was substantially quantitative and the polymer had a glass transition temperature of 105° C. The elution diagrams of these polymers in the gel permeation chromatography are shown in FIG. 4 by the solid line and broken line for the initiators of n-butyl lithium and cumyl cesium, respectively. As is understood from the results of the molecular weight determination and the gel permeation chromatography giving a broad elution curve in the former case and a double-peaked elution curve in the latter case, no monodisperse molecular weight distribution as in Example 1 could be obtained in these comparative experiments.

EXAMPLES 2 to 5

Four kinds of vinylsilyl-containing monomeric derivatives of styrene were synthesized and subjected to the anionic living polymerization each in a similar manner to that in Example 1. The solvent was either 2-methyl-tetrahydrofuran or diethyl ether (referred to as 2-Me-THF and Et$_2$O, respectively) while the polymerization initiator was always cumyl cesium. The polymerization reaction was continued for 2 hours in each of the Examples. Table 1 below indicates the monomeric compound, the solvent used, the amount of the polymerization initiator, yield of the polymer and the glass transition temperature $T_g$, the weight-average molecular weight $M_w$, the number-average molecular weight $M_n$ and the value of $M_w/M_n$ of the polymer in each of the Examples. The infrared absorption spectra of these polymeric products indicated the disappearance of the styrenic vinyl groups while the absorption band assigned to the silicon-bonded vinyl groups remained unchanged in each of the polymers.

EXAMPLE 6

The polymer obtained in Example 1 was dissolved in xylene in a concentration of 15% by weight and the solution was further admixed with 2,6-di(4-azidobenzylidene) cyclohexanone in an amount of 3% by weight based on the amount of the polymer to give a photoresist composition in a solution form.

The thus prepared photoresist solution was applied to a semiconductor silicon wafer provided with a layer of silicon dioxide on the surface by use of a spinner in a thickness of 1 μm as dried followed by prebaking at 100° C. for 20 minutes.

The photoresist layer was exposed patternwise to ultraviolet light according to a conventional procedure on a mirror-projection mask aligner (Model Canon 500-F-1) followed by development treatment for 60 seconds using diethyl ether as the developer liquid. The resolving power of the thus patterned photoresist layer was high enough to perfectly resolve the line-and-space pattern of 0.5 μm width.

With an object to examine the resistance of the photoresist layer against dry etching, a layer was formed on a silicon wafer with the above prepared photoresist solution and subjected to sputtering etching in an oxygen atmosphere in a parallel-plate electrode type apparatus for dry etching and the decrease in the thickness of the photoresist layer was determined as a function of the etching time to find that the thickness was substantially unchanged even by an etching of 30 minutes indicating the very excellent resistance of the photoresist layer against dry etching. As is evidenced by the above described results, the vinylsilyl-containing polymer with monodisperse molecular weight distribution prepared according to the invention is very promising as a base polymer in a negative type photoresist composition.

What is claimed is:

1. A method for obtaining anionic polymerization, a vinylsilyl group-containing polymeric compound having a substantially monodisperse molecular weight distribution represented by the recurring structural units of the formula

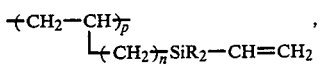

in which n is an integer of 0, 1, 2 or 3, R is a monovalent hydrocarbon group selected from the glass consisting of alkyl groups having from 1 to 4 carbon atoms and phenyl group and p is a positive integer corresponding to the degree of polymerization of the polymer and is phenylene which comprises polymerizing a vinylsilyl group containing styrene compound represented by the general formula

in which R is a monovalent hydrocarbon group selected from the class consisting of alkyl groups having from 1 to 4 carbon atoms and phenyl group and n is an integer of 0, 1, 2 or 3, under such conditions that the polymerization takes place by anionic living polymerization solely of the vinyl group directly bonded to the phenylene group —C$_6$H$_4$— leaving the vinyl group bonded to the silicon atom unpolymerized.

2. A vinylsilyl group-containing polymeric compound represented by the recurring structural units of the formula

TABLE 1

| Example No. | Monomer | Solvent | Amount of initiator, × 10$^{-4}$ moles | Polymeric product |||||
|---|---|---|---|---|---|---|---|
| | | | | Yield, % | $T_g$, °C. | $M_w$, × 10$^4$ | $M_n$, × 10$^4$ | $M_w/M_n$ |
| 2 | 1-Vinyl-4-(dimethyl vinylsilyl)benzene | 2-Me—THF | 1.2 | 100 | 95 | 5.2 | 5.0 | 1.04 |
| 3 | 1-Vinyl-4-(dimethyl vinylsilyl)methyl benzene | Et$_2$O | 1.4 | 95 | 87 | 4.8 | 4.6 | 1.04 |
| 4 | 1-Vinyl-4-(dimethyl vinylsilyl)propyl benzene | 2-Me—THF | 1.2 | 100 | 92 | 5.3 | 5.2 | 1.02 |
| 5 | 1-Vinyl-4-(dimethyl vinylsilyl)benzene | 2-Me—THF | 1.2 | 100 | 105 | 5.0 | 4.9 | 1.02 |

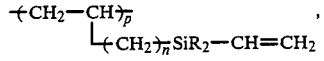

in which n is an integer of 0, 1, 2 or 3, R is a monovalent hydrocarbon group selected from the class consisting of alkyl groups having from 1 to 4 carbon atoms and phenyl group and p is a positive integer corresponding to the degree of polymerization of the polymer and is phenylene said polymeric compound having a monodispersed distribution of the molecular weight such that the ratio of Mw/Mn is 1.04 or less.

3. The method as claimed in claim 1 wherein the polymerization is performed in a solvent which is 2-methyltetrahydrofuran or a dialkyl ether in the presence of cumyl cesium at a temperature of −50° C. or below.

* * * * *